(12) United States Patent
Nakatani et al.

(10) Patent No.: US 7,198,996 B2
(45) Date of Patent: Apr. 3, 2007

(54) COMPONENT BUILT-IN MODULE AND METHOD FOR PRODUCING THE SAME

(75) Inventors: Seiichi Nakatani, Hirakata (JP); Yasuhiro Sugaya, Osaka (JP); Toshiyuki Asahi, Osaka (JP); Shingo Komatsu, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 134 days.

(21) Appl. No.: 11/152,432

(22) Filed: Jun. 14, 2005

(65) Prior Publication Data

US 2005/0230848 A1 Oct. 20, 2005

Related U.S. Application Data

(62) Division of application No. 10/779,239, filed on Feb. 13, 2004, now Pat. No. 6,939,738, which is a division of application No. 10/033,322, filed on Dec. 27, 2001, now Pat. No. 6,734,542.

(30) Foreign Application Priority Data

Dec. 27, 2000 (JP) ............................. 2000-397728

(51) Int. Cl.
*H01L 21/337* (2006.01)
(52) U.S. Cl. ............................. 438/184; 257/E21.205
(58) Field of Classification Search ......... 438/176, 438/478, 201–203, 206–211, 337, 353, 378, 438/401, 410, 184, 193, 195, 5–7, 10–11, 438/104, 106–114, 118, 141–123, 128, 129, 438/135, 142, 145, 149, 151, 157
See application file for complete search history.

(56) References Cited

U.S. PATENT DOCUMENTS 5,027,253 A 6/1991 Lauffer et al.

(Continued)

FOREIGN PATENT DOCUMENTS

JP 62-230027 10/1987

(Continued)

*Primary Examiner*—Michael Lebentritt
*Assistant Examiner*—André Stevenson
(74) *Attorney, Agent, or Firm*—Hamre, Schumann, Mueller & Larson, P.C.

(57) ABSTRACT

A component built-in module including a core layer formed of an electric insulating material, and an electric insulating layer and a plurality of wiring patterns, which are formed on at least one surface of the core layer. The electric insulating material of the core layer is formed of a mixture including at least an inorganic filler and a thermosetting resin. At least one or more of active components and/or passive components are contained in an internal portion of the core layer. The core layer has a plurality of wiring patterns and a plurality of inner vias formed of a conductive resin. The electric insulating material formed of the mixture including at least an inorganic filler and a thermosetting resin of the core layer has a modulus of elasticity at room temperature in the range from 0.6 GPa to 10 GPa. Thus, it is possible to provide a thermal conductive component built-in module capable of filling the inorganic filler with high density; burying the active component such as a semiconductor etc. and the passive component such as a chip resistor, a chip capacitor, etc. in the internal portion of the substrate; and simply producing a multilayer wiring structure.

2 Claims, 8 Drawing Sheets

U.S. PATENT DOCUMENTS

| | | |
|---|---|---|
| 5,111,278 A | 5/1992 | Eichelberger |
| 5,172,304 A | 12/1992 | Ozawa et al. |
| 5,401,688 A | 3/1995 | Yamagi et al. |
| 5,424,250 A | 6/1995 | Sawada |
| 5,459,368 A | 10/1995 | Onishi et al. |
| 5,484,647 A | 1/1996 | Nakatani et al. |
| 5,641,997 A | 6/1997 | Ohta et al. |
| 5,834,850 A | 11/1998 | Hotta et al. |
| 5,874,770 A | 2/1999 | Saia et al. |
| 6,002,592 A | 12/1999 | Nakamura et al. |
| 6,038,133 A | 3/2000 | Nakatani et al. |
| 6,060,150 A | 5/2000 | Nakatani et al. |
| 6,160,526 A | 12/2000 | Hirai et al. |
| 6,183,934 B1 * | 2/2001 | Kawamonzen ........... 430/270.1 |
| 6,242,282 B1 | 6/2001 | Fillion |
| 6,311,888 B1 | 11/2001 | Funada et al. |
| 6,359,235 B1 | 3/2002 | Hayashi |
| 6,740,964 B2 | 5/2004 | Sasaki |
| 6,774,467 B2 | 8/2004 | Horiuchi et al. |
| 6,780,668 B1 | 8/2004 | Tsukahara et al. |
| 2004/0134682 A1 * | 7/2004 | En et al. ..................... 174/258 |

FOREIGN PATENT DOCUMENTS

| | | |
|---|---|---|
| JP | 2-121392 | 5/1990 |
| JP | 3-69191 | 3/1991 |
| JP | 4-225594 | 8/1992 |
| JP | 4-283987 | 10/1992 |
| JP | 5-7063 | 1/1993 |
| JP | 6-69259 | 3/1994 |
| JP | 9-214092 | 8/1997 |
| JP | 10-173097 | 6/1998 |
| JP | 11-103147 | 4/1999 |
| JP | 11-219978 | 8/1999 |
| JP | 11-220262 | 8/1999 |
| JP | 2000-068644 | 3/2000 |

* cited by examiner

COMPONENT BUILT-IN MODULE AND METHOD FOR PRODUCING THE SAME

This application is a division of Application Ser. No. 10/779,239, filed 13 Feb. 2004, now U.S. Pat. No.6,939,738 entitled COMPONENT BUILT-N MODULE AND METHOD FOR PRODUCING THE SAME, which is a division of application Ser. No. 10/033,322. filed 17 Dec. 2001, now U.S. Pat. No.6,734,542 entitled COMPONENT BUILT-N MODULE AND METHOD FOR PRODUCING THE SAME.

BACKGROUND OF THE INVENTION

1. Field of the Invention

The present invention relates to a high-density mounted module containing an active component such as a semiconductor etc. and a passive component such as a resistor, a capacitor, etc.

2. Description of the Prior Art

Recently, with a demand for high performance and miniaturization of electronic equipment, high density and high performance of a semiconductor have been increasingly desired. This leads to a demand for a small size and high-density circuit substrate on which such a semiconductor is to be mounted. In order to meet such demands, a connection method using an inner via that can connect between wiring patterns of LSIs or components in the shortest distance has been developed in various fields in order to achieve higher density mounting.

However, there is a limitation in mounting components two-dimensionally with high density even with the above-mentioned methods. Furthermore, since these high-density mounted substrates having an inner-via structure are formed of a resin-based material, the thermal conductivity is low. Therefore, as the mounting density of components becomes higher, it is getting more difficult to release heat that has been generated by the components. In the near future, a dock frequency of a CPU is expected to be about 1 GHz. It is estimated that with the sophistication in the function of the CPU, its electric power consumption accordingly will reach 100 W to 150 W per chip. Furthermore, in accordance with high speed and high density, the effect of noise cannot be ignored. Therefore, there is an expectation for a module in which components are contained three-dimensionally, in addition to a circuit substrate with a high-density and high-performance, as well as an anti-noise property and a thermal radiation property.

In order to meet such demands, JP 2(1990)-121392A proposes a module in which a multilayer ceramic substrate is used as a substrate and a capacitor and a register are formed in an internal portion of the substrate. Such a ceramic multilayer substrate is obtained by processing a material that has a high dielectric property and can be fired simultaneously with a substrate material into a sheet and then firing the sheet sandwiched between the substrates. However, in the case where different kinds of materials are fired simultaneously, due to a lag in sintering timing or difference in the shrinkage at the time of sintering, the multilayer substrate may suffer some warping after being fired or an internal wiring may be peeled off. Therefore, it is necessary to control firing conditions precisely. Furthermore, the components involved in a ceramic substrate are based on simultaneous firing as mentioned above. Therefore, it is possible to include a capacitor, a resistor, or the like, but it is impossible to fire a semiconductor of silicon etc., which lacks in thermal resistant property, simultaneously, and thus the semiconductor cannot be contained.

On the other hand, a circuit substrate in which an active component such as a semiconductor etc. and a passive component such as a capacitor, a resistor etc. are contained at low temperatures is proposed. JP 3 (1991)-69191 A and JP11 (1999)-103147 A describe a method including the steps of: mounting electric components onto a copper wiring formed on a printed wiring board material; further coating the entire surface of the printed wiring board with resin so as to form a buried layer; and then adhering a plurality of layers by an adhesive. Furthermore, JP 9 (1997)-214092 A describes a method including the steps of: burying a material such as a dielectric material etc. in a through hole; forming a surface electrode and allowing a capacitor or a resistor to be included. In addition, there also is a method of adding a function of a capacitor etc. into a printed wiring board itself. JP 5(1995)-7063 A (U.S. Pat. No. 3,019,541) describes a capacitor built-in substrate in which electrodes are formed on both surfaces of the dielectric substrate obtained by mixing dielectric powder and resin. Furthermore, JP11 (1999)-220262 A describes a method for allowing a semiconductor, a capacitor, or the like to be contained in an inner-via structure.

As mentioned above, a conventional three-dimensionally mounted module having an inner via structure capable of realizing a high-density wiring and containing components is classified into two types: a module using a ceramic substrate that is excellent in the thermal radiation property and the air tightness; and a module that can be cured at a low temperature. The ceramic substrate is excellent in the thermal radiation property and capable of containing a capacitor with high dielectric constant, but it is difficult to fire different kinds of materials simultaneously and it is impossible to include a semiconductor. Also, there is a problem from a viewpoint of cost. On the other hand, a printed wiring board that can be cured at low temperatures has a possibility of including a semiconductor and is advantageous from the viewpoint of cost, but it is difficult to obtain a high dielectric constant in the case of a composite material mixing a dielectric material, etc. and resin. This is apparent from an example of the capacitor formed in the through hole or a printed wiring board mixing dielectric powder. In general, the printed wiring board has a low thermal conductivity and inadequate in heat resistance property. Furthermore, the method of sealing a semiconductor or a capacitor, etc. mounted on the printed wiring board with resin to allow a plurality of layers to be contained has a problem in which individual components can be contained but the thickness of the module itself for the individual components to be buried becomes large, and thus it is difficult to reduce the module volume. Furthermore, due to the thermal stress due to the difference of the coefficient of thermal expansion between the contained components and the printed wiring board, steps for providing a buffer layer having a constant coefficient of thermal expansion between the component and the printed wiring board material, adjusting the coefficient of thermal expansion of the printed circuit materials, or the like, are taken. However, the coefficient of thermal expansion of the semiconductor is generally small, and it is extremely difficult to adjust the coefficient of thermal expansion only with a printed wiring board material in the range of operation temperatures.

SUMMARY OF THE INVENTION

With the foregoing in mind, it is an object of the present invention to provide a thermal conductive component built-in module in which an inorganic filler can be contained in a thermosetting resin at high density, an active component such as a semiconductor etc. and a passive component such as a chip resistor, a chip capacitor, etc. are buried in the internal portion thereof by a simple method, and a multilayer wiring structure can be formed simply. In the present invention, by selecting an inorganic filler and a thermosetting resin, it is possible to produce a module having a desired performance and to provide a component built-in module that is excellent in a thermal radiation property and a dielectric property.

In order to solve the above-mentioned problems, the component built-in module of the present invention includes a core layer formed of an electric insulating material; an electric insulating layer and a plurality of wiring patterns formed on at least one surface of the core layer. In the component built-in module, the electric insulating material of the core layer is formed of a mixture including at least an inorganic filler and a thermosetting resin; at least one or more of active components and/or passive components are contained in an internal portion of the core layer; the core layer has a plurality of wiring patterns and a plurality of inner vias formed of a conductive resin; and the electric insulating material formed of the mixture including at least an inorganic filler and a thermosetting resin of the core layer has a modulus of elasticity at room temperature in the range from 0.6 GPa to 10 GPa.

According to such a configuration, it is possible to provide a module allowing an active component such as a semiconductor etc. and a passive component such as a chip resistor, a chip capacitor, etc. to be buried with a simple technique, having a desired performance and a high reliability with respect to stress such as a thermal shock, by selecting a suitable inorganic filler and thermosetting resin. Namely, it is possible to adjust the coefficient of thermal expansion of the module in the in-plane direction to that of a semiconductor, or to provide the module with a thermal radiation property. In addition, by setting the modulus of elasticity of the electric insulating material at room temperature to be in the range from 0.6 GPa to 10 GPa, a component such as a semiconductor can be contained without stress. Therefore, it is possible to provide a module having a high-density mounting structure. Furthermore, since it is possible to form a multilayer high density wiring layer capable of re-wiring on the surface of the core layer in which a component is contained, an ultra-thin and high-density module can be realized. Furthermore, the problem of noise that may be caused in accordance with a future development of high frequency can be expected to be reduced by arranging the semiconductor and the chip capacitor extremely close to each other.

Furthermore, the component built-in module of the present invention has a configuration in which the electric insulating material formed of the mixture including at least an inorganic filler and a thermosetting resin of the core layer has a modulus of elasticity at room temperature in the range from 0.6 GPa to 10 GPa, and the thermosetting resin includes a plurality of thermosetting resins having different glass transition temperatures. According to such a configuration, it is possible to obtain a component built-in module that is strong with respect to a thermal stress by a thermal shock of the contained components, even if components with various coefficient of thermal expansion are present.

Furthermore, the component built-in module of the present invention has a configuration in which the electric insulating material formed of the mixture including at least an inorganic filler and a thermosetting resin of the core layer has a modulus of elasticity at room temperature in the range from 0.6 GPa to 10 GPa, and the thermosetting resin includes at least a thermosetting resin having a glass transition temperature in the range from −20° C. to 60° C. and a thermosetting resin having a glass transition temperature in the range from 70° C. to 170° C. According to such a configuration, it is possible to obtain a component built-in module that is further strengthened with respect to a thermal stress by a thermal shock of the contained components, even if components with various coefficient of thermal expansion are present.

Furthermore, it is preferable that the component built-in module of the present invention includes a through hole that extends through all of the core layer, the electric insulating layer and the wiring pattern.

Thus, in addition to the above-mentioned effects, since it is possible to use a usual process and equipment for producing a printed wiring board, a component built-in module can be realized extremely simply.

Furthermore, it is preferable that the component built-in module of the present invention includes a core layer formed of an electric insulating material; an electric insulating layer including an electric insulating material formed of a mixture including an inorganic filler and a thermosetting resin, which is formed on at least one surface of the core layer; and a plurality of wiring patterns formed of a copper foil; wherein the core layer has a plurality of wiring patterns formed of a copper foil and a plurality of inner vias formed of a conductive resin, and the wiring patterns are connected electrically to each other by the inner vias.

According to such a configuration, it is possible to provide a module that allows an active component such as a semiconductor etc. and a passive component such as a chip resistor, a chip capacitor, etc. to be buried with a simple technique, having a desired performance and a high reliability with respect to stress such as a thermal shock, by selecting a suitable inorganic filler and thermosetting resin. In other words, it is possible to adjust the coefficient of thermal expansion of the module in the in-plane direction to that of a semiconductor, or to provide the module with a thermal radiation property. Furthermore, since it is possible to form a multilayer high-density wiring layer capable of re-wiring on the surface of the core layer in which a component is contained in an inner via structure, it is possible to realize an ultra-thin and high-density module.

Furthermore, it is preferable that the component built-in module of the present invention includes a core layer formed of an electric insulating material; an electric insulating layer including an insulating material formed of a thermosetting resin, which is formed on at least one surface of the core layer; and a plurality of wiring patterns formed by copper-plating; wherein the core layer has a plurality of wiring patterns formed of a copper foil and a plurality of inner vias formed of a conductive resin, and the wiring patterns formed by the copper-plating are connected electrically to each other by the inner vias.

Thus, in addition to the above-mentioned effects, it is possible to use the existing plating technique as it is, and it is also possible to make the surface wiring layer and insulating layer to be thin. Therefore, a component built-in module with a smaller thickness can be realized.

Furthermore, it is preferable that the component built-in module of the present invention includes a core layer formed of an electric insulating material; an electric insulating layer formed of an organic film having a thermosetting resin on both surfaces, which is formed on at least one surface of the core layer; and a plurality of wiring patterns formed of a copper foil; wherein the core layer has a plurality of wiring patterns formed of a copper foil and a plurality of inner vias formed of a conductive resin, and the wiring patterns are connected electrically to each other by the inner vias.

Thus, a high-density and thin surface wiring layer can be formed, and a surface that has excellent surface smoothness can be achieved by the organic film. Similarly, since the excellent thickness precision can be achieved, an impedance control of the surface wiring layer can be carried out with high accuracy, and thus a component built-in module for high frequency can be realized.

Furthermore, it is preferable that the component built-in module of the present invention includes a core layer formed of an electric insulating material; and a ceramic substrate having a plurality of wiring patterns and inner vias adhered onto at least one surface of the core layer; wherein the core layer has a plurality of wiring patterns formed of a copper foil and a plurality of inner vias formed of a conductive resin.

Thus, it is possible to obtain a module that contains components, has an excellent thermal radiation property or air-tightness, and contains a capacitor having a high dielectric constant.

Furthermore, it is preferable that the component built-in module of the present invention includes a core layer formed of an electric insulating material; and a plurality of ceramic substrates having a plurality of wiring patterns and inner vias adhered onto at least one surface of the core layer; wherein the core layer has a plurality of wiring patterns formed of a copper foil and a plurality of inner vias formed of a conductive resin; and the plurality of ceramic substrates include dielectric materials having different dielectric constants.

Thus, it is possible to laminate different kinds of layers, that is, a ceramic capacitor with high dielectric constant and a ceramic substrate with low dielectric constant suitable for a high-speed circuit. In particular, for the high-speed wiring layer, a ceramic layer with a small transfer loss can be used, while for a portion requiring a bypass capacitor, a ceramic layer with high dielectric constant can be used.

Furthermore, in the component built-in module of the present invention, it is desirable that a film-shaped passive component is disposed between the wiring patterns formed on at least one surface of the core layer. Thus, it is possible to realize a three-dimensional module in which components are contained with higher density.

Furthermore, in the component built-in module of the present invention, it is desirable that the film-shaped passive component is at least one selected from the group consisting of a resistor, a capacitor and an inductor formed of a thin film or a mixture including an inorganic filler and a thermosetting resin. It is advantageous because a thin film can provide an excellent performance passive component. Furthermore, a film-shaped component including an inorganic filler and a thermosetting resin can be produced easily and is excellent in reliability.

Furthermore, in the component built-in module of the present invention, it is desirable that the film-shaped passive component is a solid electrolytic capacitor formed of at least an oxide layer of aluminum or tantalum and a conductive macromolecule.

Furthermore, a method for producing a component built-in module of the present invention includes: processing a mixture including at least an inorganic filler and an uncured state thermosetting resin into a sheet; providing the sheet material including an inorganic filler and an uncured state thermosetting resin with a through hole; filling the through hole with a conductive resin; mounting an active component and/or passive component on a copper foil; and superimposing the sheet material in which the through hole is filled with a conductive resin onto the surface of the copper foil on which the components are mounted. This is followed by superimposing a copper foil; burying the active and/or passive component in the sheet material, followed by heating and pressing the sheet material, thereby curing the thermosetting resin and the conductive resin in the sheet material; then processing the copper foil on the outermost layer into a wiring pattern, thereby forming a core layer; and providing a through hole to a sheet including an inorganic filler and an uncured state thermosetting resin or an organic film having adhesive layers on both surfaces. This is followed by superimposing the copper foil, and the sheet or the organic film in which the through hole is filled with a conductive resin onto at least one surface of the core layer, followed by heating and pressing thereof so as to be integrated onto each other; and processing the copper foil into a wiring pattern.

According to such a method, since it is possible to bury an active component such as a semiconductor etc. and a passive component such as a chip resistor, a chip capacitor, etc. in an internal portion and also to mount components onto the outer layer portion, an extremely high-density and small size module can be realized. Furthermore, since a wiring pattern can be formed also on the surface portion of the core layer, a further high-density module can be realized. Furthermore, since a material of the surface portion can be selected, the thermal conductivity, dielectric constant, coefficient of thermal expansion, etc. can be controlled.

Furthermore, in the method for producing the component built-in module of the present invention, it is preferable that a film-shaped component is formed beforehand on the copper foil that is to be superimposed onto the core layer.

Furthermore, the method for producing a component built-in module of the present invention includes: processing a mixture including at least an inorganic filler and an uncured state thermosetting resin into a sheet; providing a through hole to the sheet material including an inorganic filler and an uncured state thermosetting resin; filling the through hole with a conductive resin; forming a wiring pattern on one surface of a release carrier; and mounting an active component and/or passive component on the wiring pattern of the release carrier. This is followed by superimposing a sheet material in which the through hole is filled with a conductive resin onto the surface of the release carrier having a wiring pattern on which the component is mounted; burying and integrating the active component and/or passive component into the sheet material, followed by further heating and pressing thereof, thereby curing the thermosetting resin and the conductive resin in the sheet material; then peeling off the release carrier on the outermost portion, thereby forming a core layer; and providing a through hole to a sheet including an inorganic filler and an uncured state thermosetting resin or an organic film having adhesive layers on both surfaces. This is followed by superimposing the release carrier having a wiring pattern, and the sheet or the organic film in which the through hole is filled with the conductive resin onto at least one surface of the core layer, followed by heating and pressing thereof so as to be integrated into each other; and peeling off the release carrier.

According to such a method, since it is possible to bury an active component such as a semiconductor etc. and a passive component such as a chip resistor, a chip capacitor, etc. in an internal portion and also to mount further components onto the outer layer portion, an extremely high-density and small size module can be realized. Furthermore, since a wiring pattern can be formed on the surface portion by a transferring process, a treatment such as etching after the curing process is not necessary, thus making the method simple from an industrial viewpoint.

Furthermore, in the method for producing the component built-in module of the resent invention, it is preferable that a film-shaped component is formed on the wiring pattern formed beforehand on the release carrier on which the wiring pattern is formed to be superimposed onto the core layer.

Furthermore, in the method for producing the component built-in module of the resent invention, it is preferable that the film-shaped component is at least one selected from the group consisting of a resistor, a capacitor and an inductor, which is formed of a thin film or a mixture including an inorganic filler and a thermosetting resin; and the film-shaped component is formed by one method selected from the group consisting of vapor deposition method, MO-CVD method or a thick film printing method.

Furthermore, the method for producing a component built-in module of the present invention includes: processing a mixture including at least an inorganic filler and an uncured state thermosetting resin into a sheet; providing a through hole to the sheet material including an inorganic filler and an uncured state thermosetting resin; filling the through hole with a conductive resin; and mounting an active component and/or passive component on a copper foil. This is followed by superimposing the sheet material in which the through hole is filled with a conductive resin onto the surface of the copper foil on which the components are mounted; furthermore superimposing a copper foil; burying the active and/or passive component in the sheet material, followed by heating and pressing the sheet material, thereby curing the thermosetting resin and the conductive resin in the sheet material; then processing the copper foil on the outermost layer into a wiring pattern, thereby forming a core layer; and providing a through hole to a sheet including an inorganic filler and an uncured state thermosetting resin or an organic film having adhesive layers on both surfaces. This is followed by superimposing the copper foil, and the sheet or the organic film in which the through hole is filled with a conductive resin onto at least one surface of the core layer, followed by heating and pressing thereof so as to be cured; and then forming a through hole that extends through the core layer so as to form a through hole by copper-plating.

Thus, since this method can use a conventional through hole technique as it is, based on the core layer containing the components, it is advantageous in industrial viewpoint.

Furthermore, the method for producing a component built-in module of the present invention includes: processing a mixture including at least an inorganic filler and an uncured state thermosetting resin into a sheet; providing a through hole to the sheet material including an inorganic filler and an uncured state thermosetting resin; filling the through hole with a conductive resin; forming a wiring pattern on one surface of a release carrier; and mounting an active component and/or passive component on the wiring pattern of the release carrier. This is followed by superimposing a sheet material in which the through hole is filled with a conductive resin onto the surface of the release carrier having a wiring pattern on which the component is mounted; burying and integrating the active component and/or passive component into the sheet material, followed by further heating and pressing thereof, thereby curing the thermosetting resin and the conductive resin in the sheet material; then peeling off the release carrier on the outermost portion, thereby forming a core layer; and providing a through hole to a sheet including an inorganic filler and an uncured state thermosetting resin or an organic film having adhesive layers on both surfaces. This is followed by superimposing the release carrier having a wiring pattern on one surface, and the sheet or the organic film in which the through hole is filled with a conductive resin onto at least one surface of the core layer, followed by heating and pressing thereof so as to be cured; and then forming a hole that extends through the core layer and carrying out copper-plating thereof to form a through hole.

Thus, since this method can use a conventional through hole technique as it is, based on the core layer containing the components, it is advantageous in industrial viewpoint.

Furthermore, the method for producing a component built-in module of the present invention includes: processing a mixture including at least an inorganic filler and an uncured state thermosetting resin into a sheet; providing a through hole to the sheet material including an inorganic filler and an uncured state thermosetting resin; filling the through hole with a conductive resin; forming a wiring pattern on one surface of the release carrier; and mounting an active component and/or passive component on a wiring pattern of the release carrier. This is followed by superimposing the sheet material in which the through hole is filled with a conductive resin onto the surface of the release carrier having a wiring pattern on which the components are mounted; further superimposing a copper foil and heating and pressing in the temperature range in which the thermosetting resin is not cured; burying and integrating the active components and/or passive components into the sheet material, thereby forming a core layer; peeling off the release carrier from the core layer; and superimposing the ceramic substrate in which at least two or more of inner vias and wiring patterns are laminated onto at least one surface of the core layer from which the release carrier is peeled off, followed by pressing thereof, thereby curing the thermosetting resin in the core layer to be adhered to the ceramic substrate.

According to such a method, similar to the above, an extremely high-density and small size module can be realized. Furthermore, since it is possible to integrate an excellent ceramic substrate with various performances, a further high-performance module can be realized.

Furthermore, in the method for producing the component built-in module of the present invention, it is desirable that a plurality of ceramic substrates having a plurality of wiring patterns and the inner vias are laminated simultaneously via the core layer and the adhesive layer. Thus, various kinds of ceramic substrates can be laminated simultaneously, providing an extremely simple method.

DESCRIPTION OF THE PREFERRED EMBODIMENTS

Figure 1:
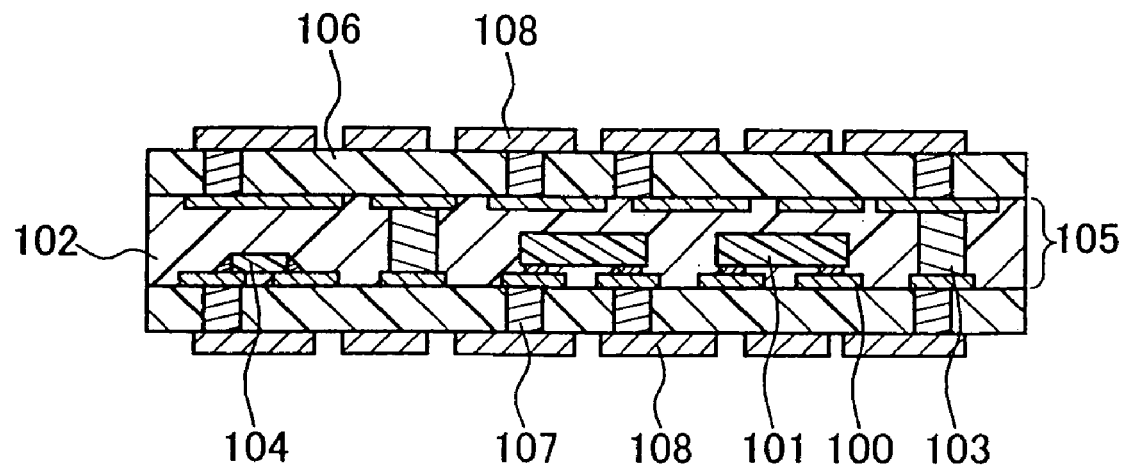
FIG. 1 is a cross-sectional view showing a component built-in module having a multilayer structure according to one embodiment of the present invention.

As a first embodiment, the present invention provides a component built-in module in which one or more of active components and/or passive components are contained in an internal portion of an electrical insulating substrate formed of a mixture obtained by adding an inorganic filler into an uncured thermosetting resin at high density; and a plurality of electric insulating layers and wiring patterns are formed on at least one surface of a core layer having a plurality of wiring patterns and inner vias formed of a conductive resin for electrically connecting the wiring patterns. In this module, the active components or passive components are contained, the wiring patterns are connected to each other by the inner vias formed of a conductive resin, and the wiring patterns are formed in a multilayer structure on the core layer containing components. Thus, extremely high-density mounting can be realized. Furthermore, by selecting an inorganic filler, a coefficient of thermal expansion in the plane direction that is the same as that of a semiconductor and high thermal conductivity can be obtained. Furthermore, since the module has a modulus of elasticity at room temperature of the electric insulating material formed of a mixture including an inorganic filler and a thermosetting resin of the core layer in which at least one of active components and/or passive components are contained in the range from 0.6 GPa to 10 GPA and the thermosetting resin is formed of a plurality of thermosetting resins having different glass transition temperatures, it is possible to obtain a component built-in module that is a strong with respect to stress due to the thermal shock of the built-in components, even if components having various coefficients of thermal expansion are present.

The component built-in module of the present invention is a mixture in which an inorganic filler is added into a thermosetting resin. It is not necessary to fire at high temperature unlike the case where a ceramic substrate is used. The component built-in module can be obtained by heating at a low temperature of about 200° C. Furthermore, as compared with a conventional resin substrate, it has a special effect that the coefficient of thermal expansion, thermal conductivity, dielectric constant, etc. can be controlled arbitrarily. The component built-in module of the present invention may have a configuration having a through hole through the core layer and the multilayer wiring layer. With such a configuration, it is possible to form a component built-in module with extremely low interlayer resistance, which is suitable for a component built-in ultraminiature power module. Similarly, in the case where a mixture including an inorganic filler and a thermosetting resin for the electric insulating layer is formed in a multilayer structure on the core layer, similar to the core layer, it is possible to control the coefficient of thermal expansion, thermal conductivity and dielectric constant.

Furthermore, as a second embodiment, the present invention provides a component built-in module having a structure in which one or more of active components and/or passive components are contained in an electrical insulating substrate formed of a mixture including at least an inorganic filler and a thermosetting resin, and a ceramic substrate having a wiring pattern and an inner via is adhered to at least one surface of a core layer having a plurality of wiring patterns formed of a copper foil and inner vias formed of a conductive resin. Thus, components can be contained with high density and various performances of the ceramic substrate can be obtained. In other words, the ceramic substrate enables the high-density wiring, as well as to make it possible to control the dielectric constant from about 3 to 10000 and further to obtain a large thermal conductivity. The component built-in module has a special effect that such performances can be utilized as it is. Furthermore, by using the thermosetting resin having the above-mentioned range of a specific modulus of elasticity and a glass transition temperature, even if the ceramic substrates have different performances and physical properties, it can be laminated without stress. Furthermore, it is possible to realize a module having a high reliability in which cracks generated by stress such as a thermal shock etc. are reduced or eliminated.

Furthermore, as a third embodiment, the present invention provides a component built-in module having a structure in which one or more of active components and/or passive components are contained in an internal portion of an electrical insulating material formed of a mixture including at least an inorganic filler and a thermosetting resin; a plurality of electric insulating layers and wiring patterns are formed on at least one surface of the core layer having a plurality of wiring patterns and inner vias formed of a conductive resin; and film-shaped active components are formed between wiring patterns formed on the core layer. Thus, since components can be contained at high density and a film-shaped component can be formed also on the wiring layer formed on the core layer, the component built-in module with extremely high mounting density can be obtained. The film-shaped components may be a resistor, a capacitor and an inductor, and lead out the wiring pattern formed on the core layer as an electrode. The resistor, capacitor or inductor can be formed in an arbitrary shape by a thick film printing method or vapor deposition method.

Furthermore, a fourth embodiment of the present invention relates to a method for producing a component built-in module. The method includes: processing a mixture including an inorganic filler and an uncured state thermosetting resin into a sheet; preparing a sheet material in which a through hole is formed and the through hole is filled with a conductive resin; superimposing a copper foil on which the active components and/or passive components are mounted onto the sheet material prepared by the above-mentioned process; further superimposing a copper foil thereon to bury the active components and/or passive components in the above-mentioned sheet material; curing thereof to form a core layer; and processing the copper foil on the outermost layer into a wiring pattern. Next, a sheet including an inorganic filler and an uncured state thermosetting resin or an organic film in which adhesives are formed on both surfaces thereof is provided with a through hole; and the sheet or the organic film in which the through hole is filled with a conductive resin is superimposed onto the copper foil of the core layer, followed by heating and pressing thereof so as to be integrated. Furthermore, a copper foil is processed into a wiring pattern.

Furthermore, a fifth embodiment of the present invention relates to a method for producing a component built-in module. The method includes: processing a mixture including an inorganic filler and an uncured state thermosetting resin into a sheet; providing the sheet material including an inorganic filler and an uncured state thermosetting resin with through holes; and filling the through holes with a conductive resin. On the other hand, a wiring pattern is formed on one surface of the release carrier and active components and/or passive components are mounted on the wiring pattern. Then, the sheet material in which the through hole is filled with the thermosetting resin is superimposed onto the surface on the side where components are mounted of the release carrier having a wiring pattern. Furthermore, a copper foil is superimposed thereon, followed by heating and pressing thereof at temperatures in the range in which the thermosetting resin is not cured so as to allow the active components and/or passive components to be buried in the sheet material to be integrated; thereby forming a core layer. Furthermore, the release carrier is peeled off from the core layer and a ceramic substrate including at least two layers or more of inner vias and wiring patterns is provided on one surface of the core layer from which the releaser carrier was peeled off and is superimposed and pressed, thereby curing the thermosetting resin in the core layer and adhering it to the ceramic substrate.

In the above-mentioned embodiments, the ceramic substrate may be a laminated capacitor with high dielectric constant, or substrates formed of two kinds of ceramic materials may be adhered simultaneously to form a ceramic substrate. By adhering the ceramic capacitor with high dielectric constant and the ceramic substrate for high-speed circuit with a low dielectric constant to the core layer containing components, a component built-in module for high frequency can be obtained.

Next, the specific embodiment of a component built-in module and a method for producing the same will be explained with reference to the accompanying drawings.

FIG. 1 is a cross-sectional view showing a configuration of a component built-in module of the present invention. In FIG. 1, reference numeral 100 denotes a wiring pattern formed on a core layer 105, and 101 denotes a bare semiconductor chip that is an active component mounted on the wiring pattern 100. Furthermore, reference numeral 104 denotes a chip component that is a passive component similarly mounted on the wiring pattern 100 and 102 denotes an electric insulating layer formed of a composite material composed of an inorganic filler and a thermosetting resin. Reference numeral 103 denotes an inner via for electrical connection between the wiring patterns 100 formed on the core layer 105. Furthermore, reference numeral 106 denotes an electric insulating layer formed on the core layer 105, 108 denotes a wiring pattern, and 107 denotes an inner via. The inner via 107 and the wiring pattern 108 are formed on the outermost layer. As shown in FIG. 1, since it is possible to contain the semiconductor 101 or the chip component 104 inside and to mount a further component on the surface of the wiring pattern 108, an extremely high-density mounted module can be obtained.

An example of the thermosetting resin includes an epoxy resin, a phenol resin and a cyanate resin. At this time, a method for controlling a modulus of elasticity and a glass transition temperature of the thermosetting resin at room temperature includes a method of adding a resin having a low modulus of elasticity and low glass transition temperature at room temperature with respect to the resin composition. Furthermore, an example of the inorganic filler includes $Al_2O_3$, MgO, BN, AlN, $SiO_2$, and the like. Furthermore, if necessary, a coupling agent, a dispersant, a coloring agent and a releasing agent may be added to the composite material including an inorganic filler and a thermosetting resin.

Figure 2:
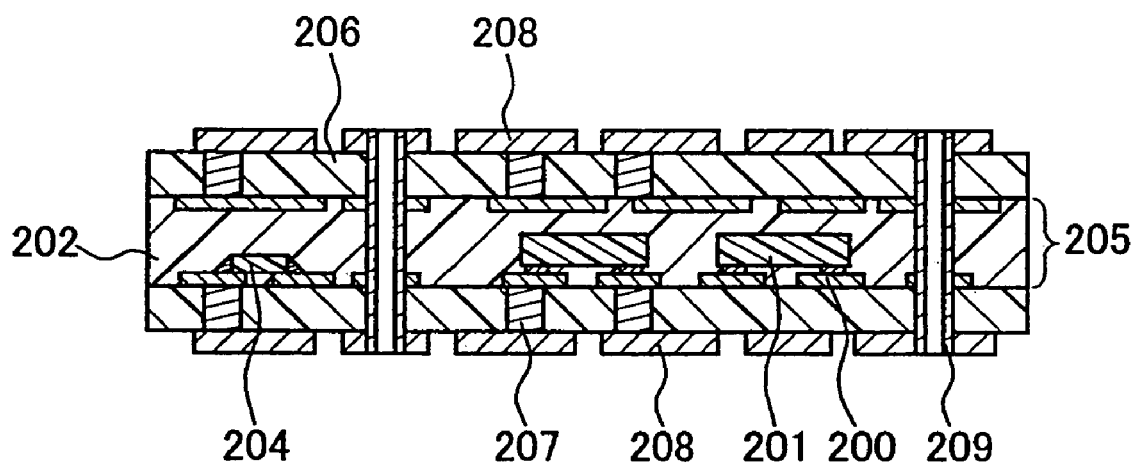
FIG. 2 is a cross-sectional view showing a component built-in module having a multilayer structure according to one embodiment of the present invention.

FIG. 2 is a cross-sectional view showing another configuration of a component built-in module of the present invention. In FIG. 2, reference numeral 209 denotes a through hole formed in such a manner to extend through the core layer 205 and the wiring layer formed on the core layer 205. The extending through hole 209 allows the core layer 205 and the wiring patterns 208 formed on the both surfaces of the core layer to be connected each other electrically. Thus, this module can be applied to a power module requiring a large electric current. The through hole 209 can be formed by carrying out a processing with a drill or a laser processing; forming a conductive layer on the wall surface of the through hole by an electrolytic copper-plating method; and further forming a wiring pattern by photolithography and a chemical etching process.

Figure 3:
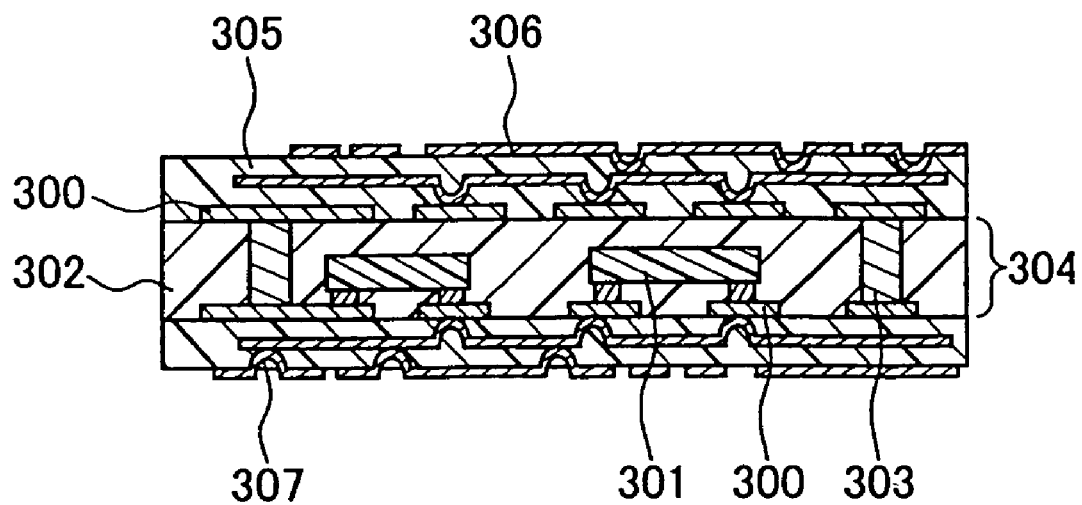
FIG. 3 is cross-sectional view showing a component built-in module having a multilayer structure according to one embodiment of the present invention.

FIG. 3 is a cross-sectional view showing another configuration of a component built-in module of the present invention. In FIG. 3, reference numeral 305 denotes an electric insulating layer formed on a core layer 304, and 306 denotes a wiring pattern formed on the electric insulating layer 305. As the electric insulating layer 305, a photosensitive insulating resin may be used. The electric insulating layer 305 can be formed by laminating a resin film or by coating a liquid photosensitive resin by using a coater. For example, the electric insulating layer 305 can be formed by processing the film-shaped photosensitive resin to form an inner via 307 by photolithography so as to make an open portion; then forming a wiring layer by electroless copper-plating or electrolytic copper-plating; and then forming a wiring pattern 306 by the existing photolithography. Furthermore, by repeating this process, a multilayer-structured wiring layer can be obtained and the inner via 307 can be formed by using the open portion formed on the electric insulating layer 305. Furthermore, by roughening the electric insulating layer before carrying out the electroless copper-plating, the adhesion strength of the copper wiring pattern 306 can be enhanced.

Figure 4:
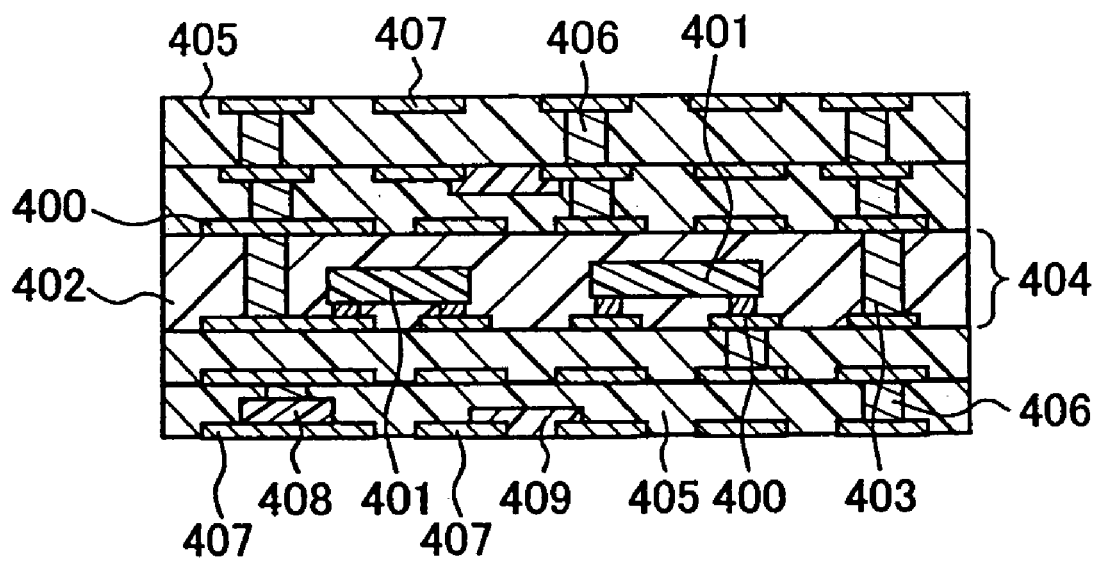
FIG. 4 is cross-sectional view showing a component built-in module having a multilayer structure according to one embodiment of the present invention.

FIG. 4 is a cross-sectional view showing another configuration of a component built-in module of the present invention. Similar to FIG. 1, FIG. 4 includes a wiring pattern 407 formed on a core layer 404 containing a semiconductor 401, an inner via 406 and an electric insulating layer 405. Furthermore, the module of FIG. 4 includes a film-shaped component that leads out the wiring pattern 407 formed on the core layer 404 as an electrode. Reference numeral 409 denotes a film-shaped component that is a resistor; and 408 denotes a film-shaped component that is a capacitor. Thus, it is possible to realize an extremely high-density component built-in module in which further film-shaped components 408 and 409 are formed on the core layer 404 containing the components.

Figure 5:
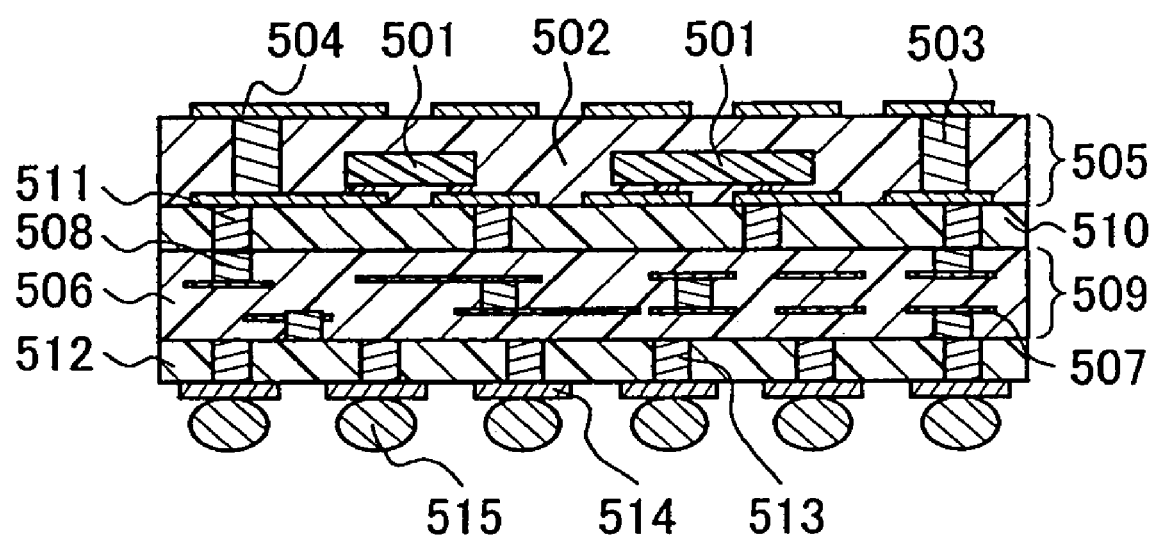
FIG. 5 is cross-sectional view showing a component built-in module having a multilayer structure according to one embodiment of the present invention.

FIG. 5 is a cross-sectional view showing another configuration of a component built-in module of the present invention. Similar to FIG. 1, FIG. 5 has a configuration in which a core layer 505 containing a semiconductor 501 and a multilayer ceramic substrate 509 obtained by simultaneously firing a sintered inner via 508, a wiring pattern 507 and a ceramic material layer 506 are adhered to each other with a sheet material 510 provided with an inner via 511 for electrical connection. The module of FIG. 5 further includes a sheet material 512 having a inner via 513 and a wiring pattern 514, which are formed on the lower part of the ceramic substrate 509. On the wiring pattern 514, a soldering ball 515 is formed. Thus, a high-density component built-in module can be obtained. By integrating with the ceramic substrate capable of high-density wiring and having various performances, a component built-in module with higher performance can be obtained.

Figure 6A:
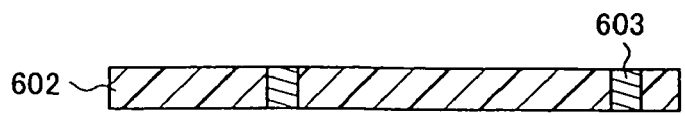
FIGS. 6A to 6H are cross-sectional views showing a process for producing a component built-in module having a multilayer structure according to one embodiment of the present invention.

FIGS. 6A to 6H are cross-sectional views showing a process for producing the component built-in module. In FIG. 6A, reference numeral 602 denotes a sheet obtained by processing a mixture including an inorganic filler and an uncured state thermosetting resin into a sheet; forming through holes in the sheet; and then filling an inner via 603 with a conductive paste. The sheet material 602 is produced as follows: a paste kneaded product is produced by mixing an inorganic filler with a liquid thermosetting resin, or by mixing an inorganic filler with a thermosetting resin whose viscosity is reduced with a solvent; and then the paste kneaded product is molded to a certain thickness and subjected to a heat treatment. Thus, the sheet material 602 is obtained.

The kneaded product using the liquid resin may have tackiness. In this case, the heat treatment allows the tackiness of the kneaded product to be eliminated while maintaining the flexibility in a state in which the kneaded product is in an uncured state or a state in which it was cured to some extent. Furthermore, in the case of the kneaded product in which the resin is dissolved in the solvent, the solvent is removed and then the tackiness is eliminated while maintaining the flexibility similarly in an uncured state. The uncured state sheet material 602 prepared by the above-mentioned process can be provided with a through hole by a laser processing or by a mold processing or by punching. In particular, in the laser processing, it is effective to use a carbon dioxide gas laser or an excimer laser from the viewpoint of the processing speed. An example of the conductive paste includes a material obtained by kneading powder of gold, silver and copper as a conductive material with the same thermosetting resin as that used in the sheet material 602. Copper is particularly effective because it is excellent in conductivity and has less migration. Furthermore, as the thermosetting resin, a liquid epoxy resin is stable from the aspect of the heat resistance property.

Figure 6B:
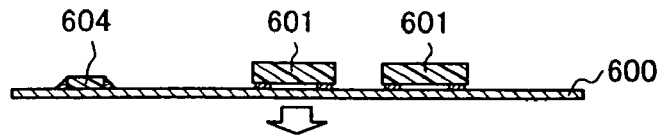

FIG. 6B shows a state in which active components such as a semiconductor 601 or a chip component 604 are mounted on a copper foil 600. At this time, the semiconductor 601 is electrically connected to the copper foil 600 via a conductive adhesive. A copper foil 600 having a thickness of about 18 μm to 35 μm and produced by electrolytic plating can be used. In particular, the copper foil whose surface that is in contact with the sheet material 602 is roughened is desirable for improving the adhesion with the sheet material 602. Furthermore, the copper foil whose surface has been subjected to a coupling treatment or plated with tin, zinc or nickel may be used in order to improve the adhesion property and oxidation resistance. As the adhesive for flip-chip mounting of the semiconductor 601, an adhesive obtained by kneading gold, silver, copper, silver-palladium alloy, or the like with a thermosetting resin can be used. Instead of the conductive adhesive, a bump produced by a solder bump or a gold wire bonding may be formed on the side of the semiconductor 601 beforehand, and the semiconductor 601 can be mounted on the copper foil by the use of melting by a heat treatment. Furthermore, the solder bump can be used together with the conductive adhesive.

Figure 6C:
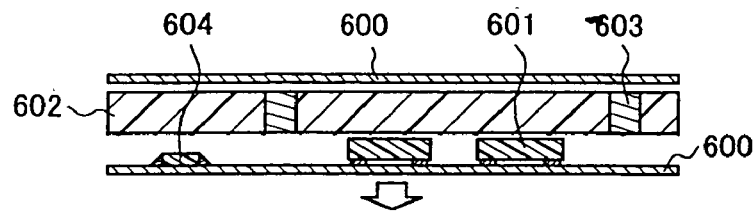

Next, in FIG. 6C, reference numeral 600 denotes a copper foil that was prepared separately. FIG. 6C shows a state in which the sheet material 602 produced in the above-mentioned process and the copper foil 600 on which the semiconductor 601 and the chip component 604 are mounted are superimposed.

Figure 6D:
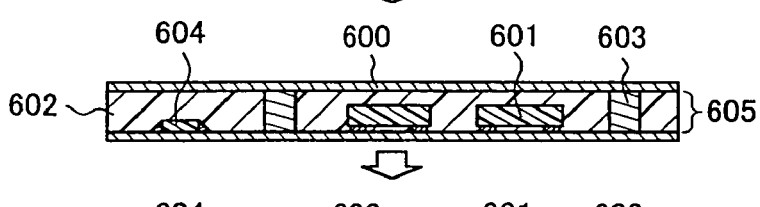
Figure 6E:
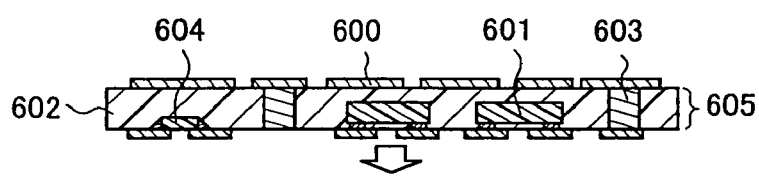
Figure 6F:
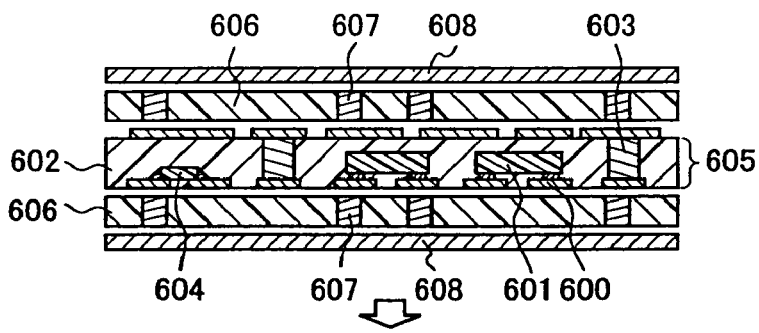
Figure 6G:
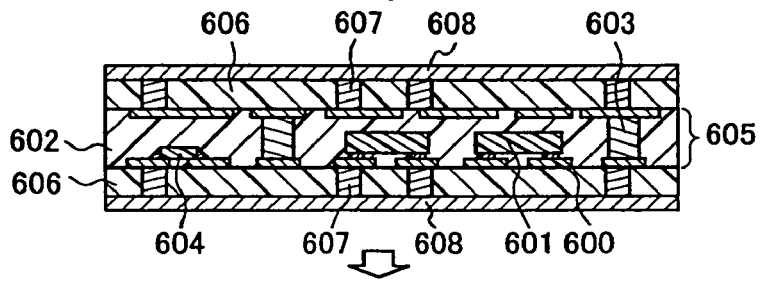
Figure 6H:
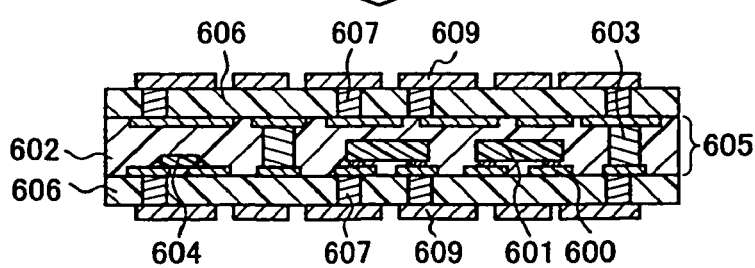

Next, FIG. 6D shows a state in which the product that was superimposed is heated and pressed by a press, so that the semiconductor 601 and the chip component 604 are buried to be integrated into the sheet material 602. At this time, the components are buried in a state before the thermosetting resin in the sheet material 602 is cured, and further heating is carried out to be cured and thus the thermosetting resin in the sheet 602 and the thermosetting resin in the conductive resin are cured completely. This process allows the sheet material 602, the semiconductor 601, the chip component 604 and the copper foil 600 be adhered strongly to each other mechanically. Similarly, the conductive paste is cured for an electrical connection between the copper foils 600. Next, as shown in FIG. 6E, the copper foil on the surface of the substrate in which the thermosetting resin is cured and the semiconductor 601 is buried and integrated is processed into a wiring pattern 600. Thus, a core layer 605 is formed. FIG. 6F shows a state in which the core layer 605 is sandwiched between sheet materials 606 formed of a mixture including an inorganic filler and an uncured state thermosetting resin or organic films having adhesive layers on both surfaces, on which a through hole is formed and the through hole is filmed with a conductive paste; and then the copper foils 608 are further superimposed thereon. Then, heating and pressing are carried out, thereby forming a wiring layer on both surfaces of the core layer 605 as shown in FIG. 6G. Then, as shown in FIG. 6H, the adhered copper foils 608 are subjected to a chemical etching so as to form a wiring pattern 609. Thus, a component built-in module can be obtained. Thereafter, steps for mounting components by soldering or filling of an insulating resin are carried out, but such steps are not essential herein, so the explanation therefor is omitted herein.

Figure 7A:
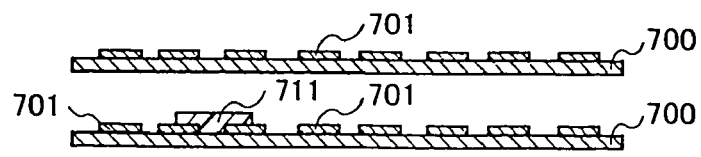
FIGS. 7A to 7I are cross-sectional views showing a process for producing a component built-in module having a multilayer structure according to one embodiment of the present invention.

FIGS. 7A to 7I are cross-sectional view showing a method for producing a component built-in module produced by the use of the sheet material 704 produced by the same method as described with reference to FIG. 6. In FIG. 7A, a wiring pattern 701 and a film-shaped component 711 are formed on a release carrier 700. The film-shaped component 711 leads out the wiring pattern 701 as an electrode. The release carrier 700 is released after the wiring pattern 701 and the film-shaped component 711 are transferred. For example, an organic film such as polyethylene, polyethylene terephthalate or the like, or a metal foil of copper etc. can be used for the release carrier. The wiring pattern 701 can be formed by attaching a metal foil such as a copper foil to the release carrier 700 via an adhesive, or by further forming a wiring pattern by electrolytic plating on the metal foil, or the like.

Figure 7B:
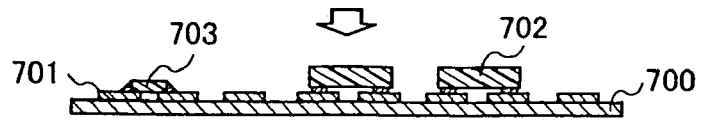
Figure 7C:
Figure 7D:
Figure 7E:
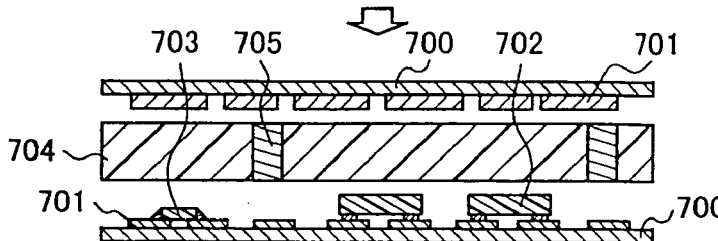
Figure 7F:
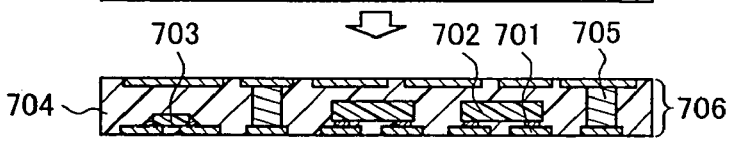

The metal layer that was formed in a film shape like this can be formed into a wiring pattern 701 by the existing method such as a chemical etching method etc. FIG. 7B shows a state in which a semiconductor 702 or a chip component 703 is mounted on the wiring pattern 701 formed on the release carrier 700. FIG. 7C shows a sheet material 704 produced by the same method as described with reference to FIG. 6. FIG. 7D shows a state in which a through hole is processed and an inner via 705 is filled with a conductive paste by the same method as described with reference to FIG. 6. FIG. 7E shows a state in which the prepared sheet material 704 provided with the inner via 705 filled with a conductive paste prepared by the above-mentioned method is sandwiched between the release mold carrier 700 on which the wiring patterns 701 are formed and the release carrier 700 on which the components are mounted in a suitable position. FIG. 7F shows a state in which heating and pressing are carried out so as to cure the thermosetting resin in the sheet material 704 and to peel off the release carrier 700. This heating and pressing allows the semiconductor 702 and chip component 703 to be buried and integrated into the sheet material 704. The semiconductor 702 and the chip component 703 are buried in the sheet material 704 in a state before the sheet material 704 is cured, and further heating is carried out to be cured, and thus the thermosetting resin in the sheet material 704 and the thermosetting resin of the conductive paste are cured completely. This process allows the sheet material 704, the semiconductor 702 and wiring pattern 701 to be adhered strongly to each other mechanically. Similarly, by curing the conductive paste in the inner via 705, the wiring pattern 701 can be connected electrically. At this time, due to the thickness of the wiring pattern 701 on the release carrier 700, the sheet material 704 is further compressed, so that the wiring pattern 701 also is buried in the sheet material 704. Thus, a component built-in core layer 706 in which the surfaces of the wiring pattern and the module are smooth can be formed.

Figure 7G:
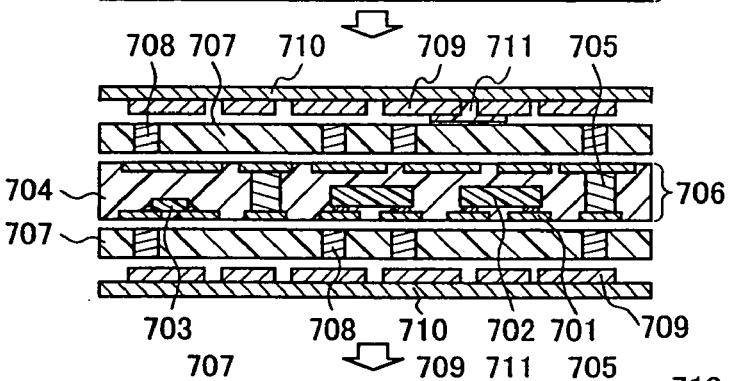
Figure 7H:
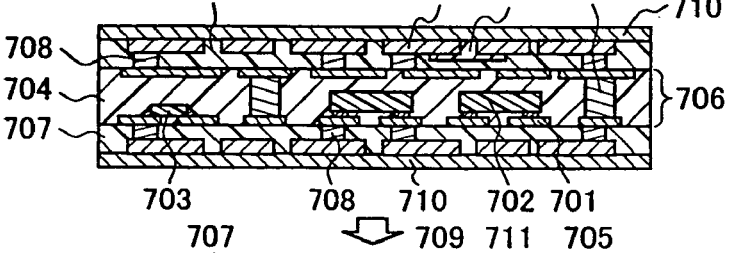
Figure 7I:
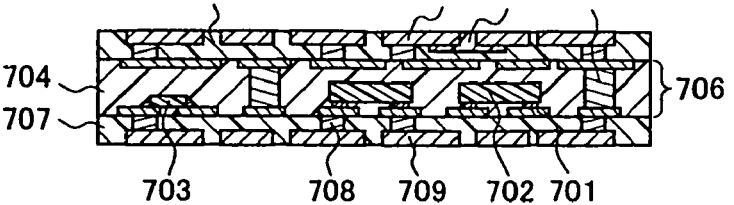

Next, in FIG. 7G, the component built-in core layer 706 produced by the above-mentioned process is sandwiched between the sheet material 707 produced according to the method described with reference to FIG. 7D and the release carrier 710 on which a film-shaped component 711 is formed in a suitable position, followed by heating and pressing. Thus, the multilayer module can be produced as shown in FIG. 7H. Finally, as shown in FIG. 7I, by peeling off the release carrier 710, the multilayer module of the present invention can be produced. Thus, by using the core layer in which the semiconductor and the chip component are contained and the release carrier on which the wiring pattern and film-shaped components are formed, it is possible to obtain a component built-in module having higher density and various functions.

Figure 8A:
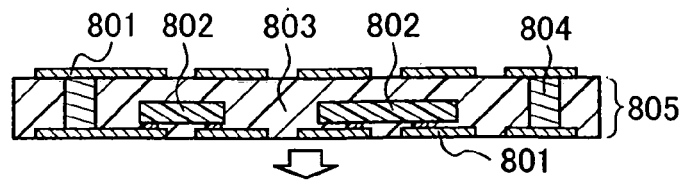
FIGS. 8A to 8D are cross-sectional views showing a process for producing a component built-in module having a multilayer structure according to one embodiment of the present invention.
Figure 8B:
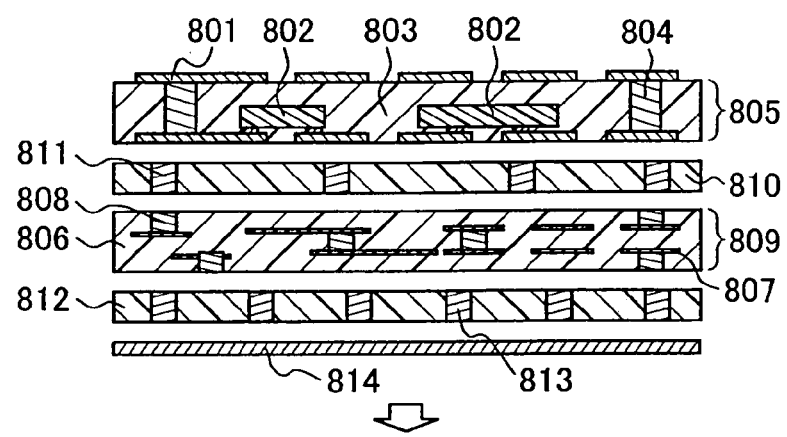
Figure 8C:
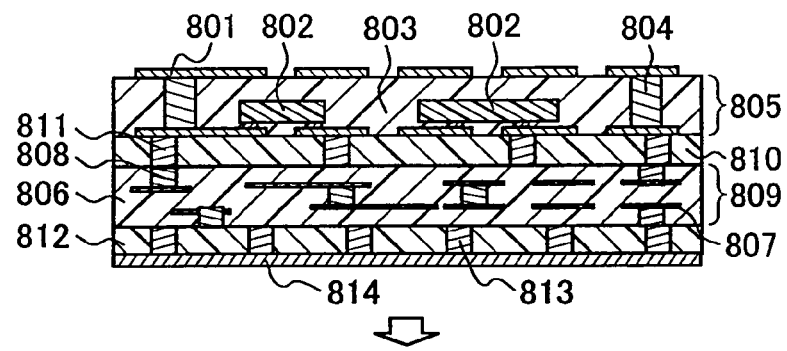
Figure 8D:
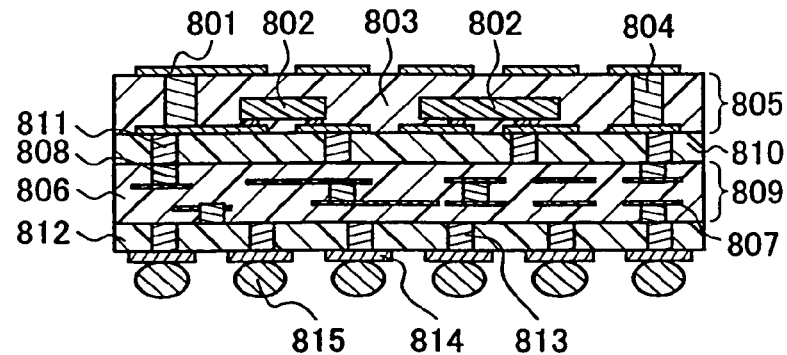

FIGS. 8A to 8D show cross-sectional views showing a process for producing a component built-in module obtained by laminating onto a multilayer ceramic substrate. FIG. 8A shows a core layer 805 in which components are contained, which is shown in FIG. 6E. Then, FIG. 8B shows a state in which the core layer 805 and a multilayer ceramic substrate 809 are used and a sheet material provided with an inner via 811 and a sheet material similarly provided with the inner via 813 are superimposed as shown in FIG. 8B and then a copper foil 814 is further superimposed. Next, as shown in FIG. 8C, by heating and pressing the laminate the thermosetting resins in the sheet materials 810 and 812 are cured, so that the core layer 805 and the multilayer ceramic substrate 809 and copper foil 814 are strongly adhered to each other mechanically. As shown in FIG. 8D, by finally processing the copper foil 814 into a wiring pattern and by providing a solder ball 815, a component built-in module in which the multilayer ceramic and the component built-in core layer are integrated is completed. Furthermore, the multilayer ceramic wiring substrate is formed by using a green sheet formed of low temperature firing material mainly including glass and alumina. Namely, the green sheet capable of firing at about 900° C. is provided with a through hole and the through hole is filled with a conductive paste including a highly conductive powder such as copper and silver, and furthermore, the wiring pattern is formed by printing a similar conductive paste. A plurality of the green sheets formed by the above-mentioned process are laminated and further fired so as to form the low temperature firing material. The ceramic substrate material produced by the above-mentioned process may use a high dielectric material mainly including barium titanate, a high thermal conductive material mainly including aluminum titanate, etc., or the like. Furthermore, the wiring pattern of the outermost layer of the ceramic laminate may be formed or only ceramic laminate may be formed without forming the wiring pattern. Furthermore, in FIGS. 8D to 8A, one ceramic substrate was used. However, a plurality of substrates containing various kinds of ceramic materials may be laminated simultaneously.

Hereinafter, the present invention will be explained in detail by way of examples.

EXAMPLE 1

In the production of a component built-in module of the present invention, first, a method for producing a sheet material including an inorganic filler and a thermosetting resin will be explained. The sheet material used in this example is prepared by, at first, mixing an inorganic filler and a liquid thermosetting resin with an agitator. The agitator used in this example operates in such a manner that an inorganic filler, a liquid thermosetting resin, and if necessary, a solvent for adjusting the viscosity of the mixture are placed in a predetermined amount in a container, and the container itself is rotated while stirring the mixture in the container. The mixture obtained should be dispersed sufficiently, even if the mixture has a relatively high viscosity. Tables 1 and 2 show the composition mixed in the sheet material for the component built-in module in this example.

TABLE 1

| | Composition of thermosetting resin | | | | | |
|---|---|---|---|---|---|---|
| | thermosetting resin 1 | | | thermosetting resin 2 | | |
| | content | wt. % | Tg(° C.) | content | wt. % | Tg(° C.) |
| case 1 | epoxy resin (6041)*1 | 10 | 75 | — | — | — |
| case 2 | epoxy resin (WE-2025)*2 | 5 | 50 | epoxy resin (6018)*5 | 5 | 130 |

TABLE 1-continued

| | Composition of thermosetting resin | | | | | |
|---|---|---|---|---|---|---|
| | thermosetting resin 1 | | | thermosetting resin 2 | | |
| | content | wt. % | Tg(° C.) | content | wt. % | Tg(° C.) |
| case 3 | epoxy resin (Epicure, YH-306)*3 | 10 | 110 | — | — | — |
| Co | epoxy resin (6099)*4 | 10 | 178 | — | — | — |

Co: Comparative Example
*1manufactured by Asahi Ciba
*2manufactured by Nippon Pelnox Corporation
*3manufactured by Yuka Shell Epoxy
*4manufactured by Asahi Ciba
*5manufactured by Asahi Ciba

TABLE 2

| | composition of inorganic filler | | Modulus of elasticity at room temperature |
|---|---|---|---|
| | content | wt. % | (GPa) |
| case 1 | alumina powder (AS-40)*1 average particle diameter: 12 μm | 90 | 0.72 |
| case 2 | alumina powder (AS-40)*1 average particle diameter: 12 μm | 90 | 7.6 |
| case 3 | alumina powder (AS-40)*1 average particle diameter: 12 μm | 90 | 7.7 |
| Co | alumina powder (AS-40)*1 average particle diameter: 12 μm | 90 | 36.5 |

Co: Comparative Example
*1manufactured by Showa Denko K.K.

Specifically, a sheet material is produced in the following manner. A predetermined amount of the paste mixture with the composition mentioned above is poured and spread on a release film. Mixing was carried out under the conditions: a predetermined amount of inorganic filler and the epoxy resin are placed in a container and were mixed in the container by a planetary mixer. The planetary mixer operates in such a manner in which the container itself is rotated while revolving. The kneading is carried out for a time as short as 10 minutes. A polyethylene terephthalate film having a thickness of 75 μm was used for the release film, and the surface of the film was subjected to a release treatment with silicon. Then, another release film was superimposed onto the mixture on the release film that had been poured and spread, followed by pressing with a pressurizing press so that the sheet has a constant thickness. Next, the release film on one surface was peeled off and was heated together with the release film under the conditions that allow the elimination of the tackiness of the sheet by removing the solvent. The heat treatment is carried out under the conditions: temperature of 120° C. and holding time of 15 minutes. Thus, the above-mentioned mixture is formed into a sheet material having a thickness of 500 μm and not having tackiness. The thermosetting epoxy resin used in this example starts to be cured at 130° C., and therefore the epoxy resin was in an uncured state (B stage) under the above-mentioned heat treatment condition, and the resin can be melted again by a heat treatment in subsequent processes.

Figure 9:
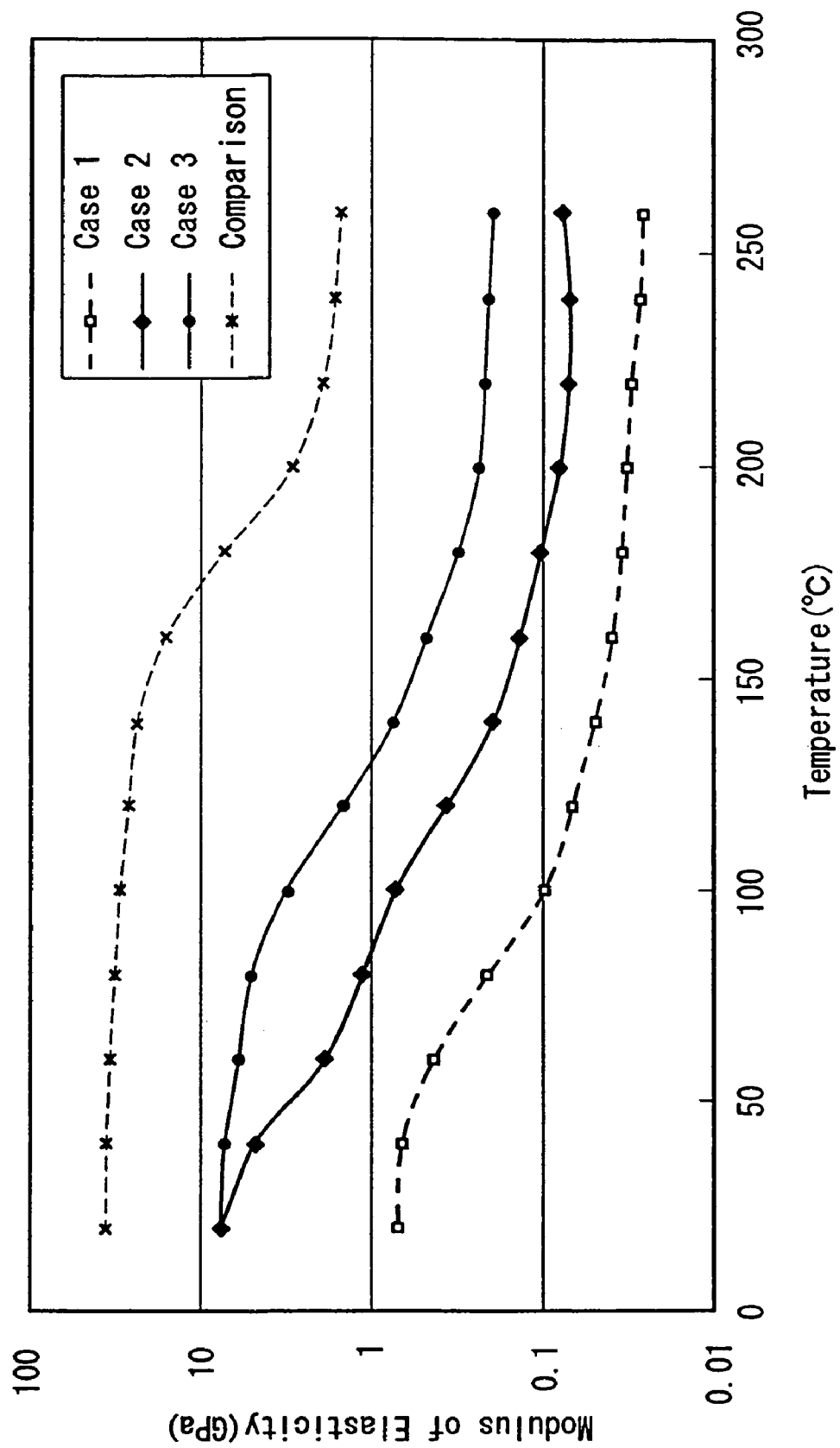
FIG. 9 is a graph showing temperature characteristics of a modulus of elasticity of an electric insulating material of a component built-in module.
Figure 10:
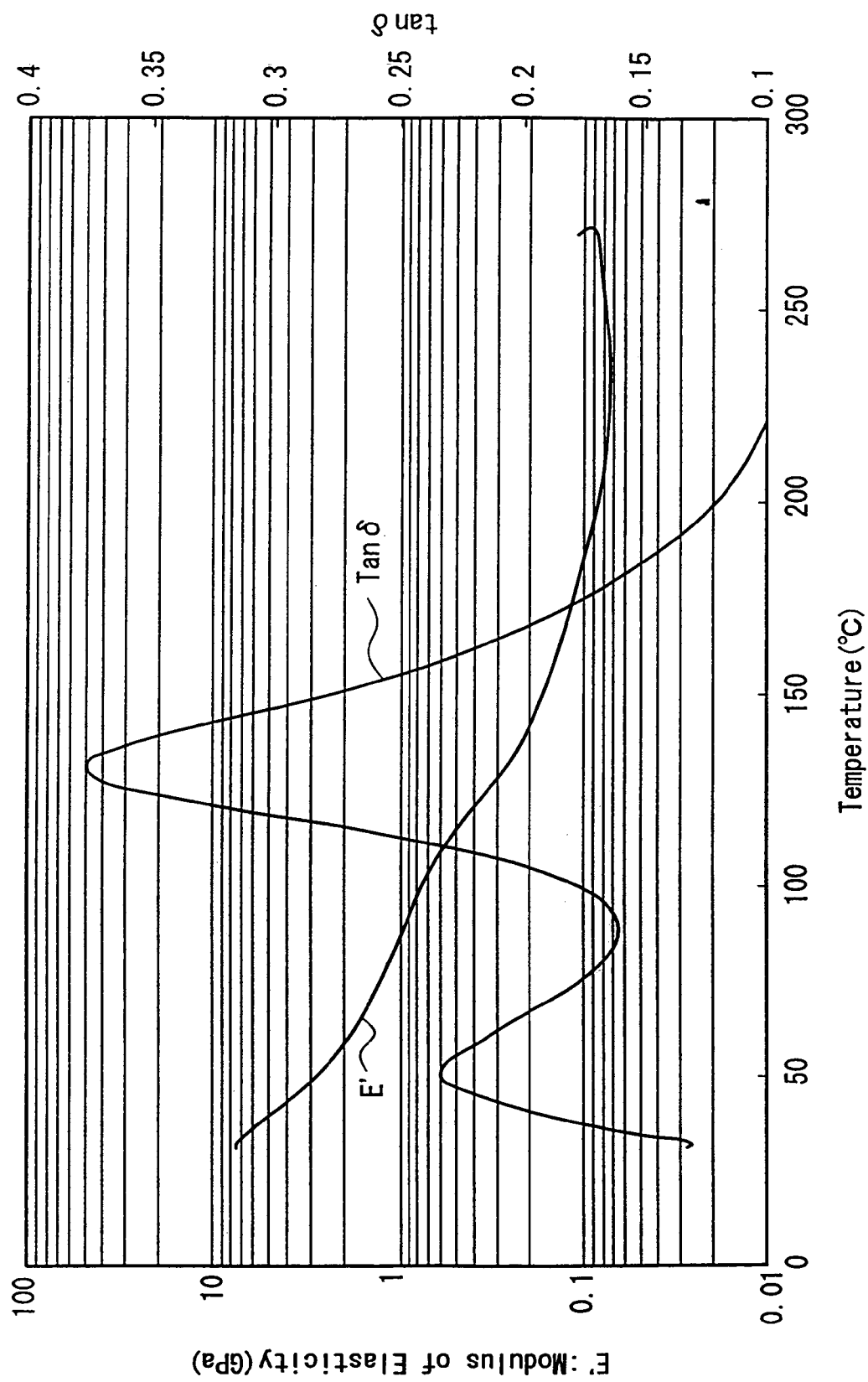
FIG. 10 is a graph showing a modulus of elasticity E' and Tanδ of the electric insulating material of a component built-in module according to one embodiment of the present invention.

In order to evaluate the physical properties of the sheet material produced by the above-mentioned process, a thermal pressing was carried out and the cured product of the sheet was produced. Then, a modulus of elasticity and glass transition temperature of the cured product were measured. The thermal pressing was carried out under the conditions: the produced sheet was sandwiched between the release films and was subjected to a thermal pressing at 200° C. and a pressure of 4.9 MPa for 2 hours. The modulus of elasticity and glass transition temperature (Tg) of the cured product at room temperature are shown in the above-mentioned Tables 1 and 2, and the temperature characteristics of the modulus of elasticity are shown in FIG. 9, respectively. As shown in Tables 1 and 2, the modulus of elasticity of the cured product at room temperature ranges between about 0.7 GPa and about 8 GPa. As a comparative example, the cured product using an epoxy resin having a modulus of elasticity of 36.5 GPa was prepared. Furthermore, as in the case 2, a cured product in which an epoxy resin having a different glass transition temperature was added also was evaluated. The glass transition temperature was calculated from Tan δ representing the viscosity behavior of the modulus of elasticity based on the temperature characteristics of the modulus of elasticity E' as shown in FIG. 10. FIG. 10 shows the temperature characteristics of the modulus of elasticity E' of the case 2. From an inflection point of Tan δ, it is confirmed that the glass transition temperature of this mixture is 50° C. and 130° C., respectively.

The uncured sheet material having the above-mentioned physical property was cut into a predetermined size, and through holes having a diameter of 0.15 mm were formed at constant pitch of 0.2 mm to 2 mm by using a carbon dioxide gas laser. The through holes were filled with a conductive paste by a screen printing method. The through holes were filled with a kneaded product including 85 wt % of spherical copper particles having an average particle diameter of 2 μm as a conductive paste for filling via holes, 3 wt % of bisphenol A epoxy resin ("Epicoat 828" manufactured by Yuka Shell Epoxy) and 9 wt % of glycidyl ester based epoxy resin ("YD-171" manufactured by Toto Kasei) as a resin composition, and 3 wt % of amine adduct hardening agent ("MY-24" manufactured by Ajinomoto Co., Inc.) as a hardening agent by using a triple roll (see FIG. 6A). Next, a semiconductor 601 and a chip component 604 are flip-chip mounted onto a 35 μm-thick copper foil 600 whose one surface was roughened with a conductive adhesive including a silver powder and an epoxy resin. The sheet material is sandwiched between the copper foil 600 produced by the above-mentioned process on which the semiconductor was mounted and another prepared 35 μm-thick copper foil 600 whose one surface was roughened in a suitable position. At this time, the roughened surface of the copper foil was arranged so as to face the side of the sheet material. Then, heating and pressing were carried out by a thermal press at a temperature of 120° C. and a pressure of 0.98 MPa for 5 minutes. Since the thermosetting resin in the sheet material 602 was softened by heating, the semiconductor 601 and a chip component 604 are buried in the sheet material. Then, the heating temperature was raised to 175° C. and the state was held for 60 minutes. This heating allowed the production of a core layer 605 in which the epoxy resin in the sheet material and the epoxy resin in the conductive resin were cured, so that the semiconductor and the copper foils were strongly connected to the sheet material mechanically, and the conductive paste and the copper foil were adhered to each other electrically (through inner-via connection) and mechanically. Then, by etching the surface of the copper foil on which the core layer 605 in which the semiconductor was buried, an electrode pattern and a wiring pattern having a diameter of 0.2 mm are formed on the inner via hole.

The multilayer structure is obtained by using the core layer 605 produced as mentioned above. The used sheet material was obtained by coating the epoxy resin ("EF-450" manufactured by Nippon Rec Co. Ltd.) as an adhesive to the thickness of 5 μm onto the both surfaces of a 25 μm-thick aramid film ("Aramica" manufactured by Asahi Kasei) and forming a through hole by using a carbon dioxide gas laser processing machine. The diameter of the through hole was 100 μm and the through hole was filled with the above-mentioned conductive paste (see FIG. 6F). The sheet material processed by the above-mentioned process on which the adhesive layer was formed on the organic film was superimposed on both surfaces of the core layer 605. Furthermore, an 18 μm-thick copper foil 608 whose one surface was roughened was superimposed, followed by heating and processing thereof. Then, the copper foil 608 of the uppermost layer was processed into a pattern. Thus, the component built-in module was obtained.

In order to evaluate the reliability of the component built-in module produced by the method in this example, a hygroscopicity reflow test and a thermal shock test (a temperature cycle test) were conducted. The hygroscopicity reflow test was conducted by allowing the component built-in module, which was held at a temperature of 85° C. and at a humidity of 85% for 168 hours, to pass through a belt type reflow tester for 20 seconds once at a maximum temperature of 240° C. The thermal shock test was conducted by allowing the component built-in module to stand at 125° C. for 30 minutes and then at −40° C. for 30 minutes per cycle, and repeating this cycle 1000 times.

As an evaluation after each test, when the resistance value of the inner via connection formed in the component built-in module (100 inner vias are connected in series) remained within ±10%, the component built-in module was evaluated as good. When cut-off or 10% or more increase in the connection resistance occurred, the component built-in module was evaluated as bad. Furthermore, as an evaluation standard with respect to the contained components, one without cut-off in the connecting surface of the built-in module and deterioration of the component performance was evaluated as good, while a component in which the electrical connection of the contained component is changed by ±10% or more similar to the inner via connection or a component in which the component performance was changed was evaluated as bad. At this time, no visible cracks were generated in the component built-in module in this example, and abnormality was not recognized, even if a supersonic flaw detector was used. For the contained component, chip resistors (20 chips), chip capacitors (20 chips) and test semiconductor (1 chip, the number of connection terminals: 30) were used. The evaluation of the reliability is shown in Table 3.

TABLE 3

| | | | Evaluation of reliability | | | |
| | | | thermal shock test (number of bad/ number of test) | | hygroscopicity reflow test (number of bad/ number of test) | |
| | *1 (GPa) | *2 Tg (° C.) | reliability in via connection | reliability in contained component | reliability in via connection | reliability in contained component |
| --- | --- | --- | --- | --- | --- | --- |
| case 1 | 0.72 | 75 | 0/100 | 0/70 | 2/100 | 1/70 |
| case 2 | 7.6 | 50/130 | 0/100 | 0/70 | 0/100 | 0/70 |
| case 3 | 7.7 | 110 | 1/100 | 0/70 | 0/100 | 0/70 |
| Co | 36.5 | 178 | 12/100 | 25/70 | 9/100 | 34/70 |

Co: Comparative Example
*1 Modulus of elasticity at room temperature
*2 glass transition temperature As is apparent from Table 3, it is confirmed that when the modulus of elasticity at room temperature is in the range of 0.6 GPa or more and 10 GPa or less, excellent reliability is obtained. In particular, in the comparative example, since the modulus of elasticity at room temperature is high, the deterioration of the inner via connection or the contained component were significantly increased due to a pressure stress at the time of the thermal shock. It is thought that when the modulus of elasticity is high with respect to the pressure generated by the difference in the coefficient of thermal expansion, the stress becomes high, which may lead to a cut-off in the connection portion on which the stress is concentrated. Furthermore, in the comparative example, since the glass transition temperature is high, even if the modulus of elasticity is high even at high temperature. On the other hand, in the cases 1 to 3, relatively high reliability can be obtained. In particular, it is thought that the case 2 using two kinds of epoxy resins having different moduli of elasticity, even if the modulus of elasticity at room temperature is not so low, since the modulus of elasticity is lowered in accordance with the increase of the temperature (see FIG. 10), high reliability can be maintained. Furthermore, the insulating material of the case 1 in which the modulus of elasticity at room temperature is the lowest shows an excellent performance in the thermal shock test but shows somewhat inferior reliability in the reflow test in a moisture state. This reliability problem is practically trivial. However, if the modulus of elasticity is further lowered, the hygroscopicity is increased, which leads to a problem in the hygroscopicity test. As is dear from the above, in order to obtain a higher reliability, it is good to use epoxy resins having a plurality of moduli of elasticity and glass transition temperatures as in the case 2.

This shows that the semiconductor and the module are adhered tightly. Furthermore, the inner via connection resistance by a conductive paste both in the core layer and the wiring layer were not changed from the initial performance.

EXAMPLE 2

In Example 2, a module containing a semiconductor was made by using a sheet material same as the case 2 in Example 1.

A 500 µm-thick sheet material 704 in which a through hole was filled with a conductive paste produced under the same conditions as those in Example 1 was prepared (see FIG. 7D). Next, a 70 µm-thick copper foil was formed into a release carrier and further a 9 µm-thick copper was formed on the release carrier by an electrolytic copper-plating method. A wiring pattern was formed by using this release carrier. The release carrier on which the 9 µm-thick copper was formed was chemical-etched by photolithography so as to form a wiring pattern 701 shown in FIG. 7A. A semiconductor and a chip were flip-chip mounted onto the thus produced release carrier with a wiring pattern produced with a solder bump. Furthermore, a film-shaped component was formed on a release carrier having another wiring pattern by a printing method. The film-shaped component 711 is a resistance paste obtained by mixing a carbon powder with a thermosetting resin. The printing was carried out by the existing screen printing method.

The sheet material 704 filled with a conductive paste is sandwiched between the release carrier produced by the above-mentioned method on which the semiconductor was mounted and another release carrier having only wiring pattern in a suitable position. At this time, the sheet was sandwiched between the release carries so that the wiring pattern faced the sheet material. Then, heating and pressing were carried out by a hot-press at a temperature of 120° C. and a pressure of 0.98 MPa for 5 minutes. Since the thermosetting resin in the sheet was softened by heating at a temperature, the semiconductor 702 and chip component 703 are buried in the sheet material. Furthermore, the heating temperature was raised to 175° C. and this state was held for 60 minutes. This heating allowed the epoxy resin in the sheet and the epoxy resin in the conductive resin composition to be cured, so that the semiconductor and the copper foils are strongly connected to the sheet material mechanically. This heating also allows the conductive paste and the wiring pattern 701 to be connected to each other electrically (through inner-via connection) and mechanically. Next, the release carrier on the surface of the cured product in which the semiconductor was buried was peeled off. Since the release carrier has a lustrous surface and the wiring layer is formed by electrolytic plating, only the copper foil that is the release mold carrier can be peeled off. In this state, a core layer 706 in which the component was contained was formed. Then, a further wiring layer is formed by using the core layer 706. In this method, since a release mold carrier on which the wiring pattern was formed beforehand is used, the cured module becomes a smooth core layer in which the wiring pattern is buried in the module. Thus, fine multilayer wiring can be formed on the surface of the core layer. Furthermore, since the wiring pattern also is buried, the sheet material is compressed by a thickness of the wiring pattern on the surface. Therefore, it is possible to obtain an electrical connection of a conductive paste with excellent reliability.

Next, a multilayer wiring layer is produced by using the core layer in which a semiconductor and a chip component are contained. The core layer is sandwiched between the 100 µm-thick sheet material filled with the conductive paste that was formed in Example 1 and the release carrier 700 having a wiring pattern 701 on a film-shaped component 711 as shown in FIG. 7G. Then, heating and pressing are carried out under the conditions as mentioned above so as to cure the multilayer product, and thereby the wiring pattern 701 on the core layer and release carrier and the film-shaped component 711 are integrated. Furthermore, by peeling off the release carrier 710 after curing the component built-in module of the present invention is obtained. With the use of the release carried like this, a wet process such as chemical etching is not necessary in the production of the substrate, and thus a fine wiring pattern can be obtained simply. Furthermore, there is a specific effect in that in the case of the release carrier using an organic film, since it is possible to evaluate the mounting performance before embedding components, bad components can be repaired on the release carrier.

In order to evaluate the reliability of the component built-in module produced in this example, a hygroscopicity reflow test and a thermal shock test (a temperature cycle test) were conducted under the same conditions as in Example 1. At this time, no cracks were generated in the semiconductor built-in module in appearance, and abnormality was not recognized, even if a supersonic flaw detector was used. These tests confirmed that the semiconductor and the insulating substrate are adhered to each other strongly. Furthermore, a resistance value of the inner-via connection by the conductive paste, the connection between contained components and component performance were hardly changed from the initial performance.

EXAMPLE 3

In Example 3, a higher density module is produced by using a core layer in which a semiconductor is contained in the sheet material as in a case 2 of Example 1 and a multilayer ceramic substrate.

A core layer 805 containing a semiconductor 802 produced under the same conditions as in Example 1 was used (see FIG. 8A). The thickness of the core layer is 300 µm. Next, the multilayer ceramic substrate 809 and the core layer 805 are laminated with an adhesive layer. Moreover, the ceramic multilayer substrate is produced by using a 20 µm-thick green sheet ("MLS-1000" manufactured by Nippon Electric Glass Co., Ltd.) formed of a low temperature firing material mainly including glass and alumina. Namely, a multilayer ceramic substrate was formed as follows: a through hole having a 0.2 mm diameter was formed on the green sheet by a puncher; the through hole was filled with a conductive paste obtained by mixing silver powders having an average particle diameter of 2 µm as a main component, an ethyl cellulose resin and a terpineol solvent; and a wiring pattern was formed by printing the similar conductive paste. A plurality of the green sheets produced by the above-mentioned method were laminated at a temperature of 70° C. and a pressure of 4.9 MPa and further fired at a temperature of 900° C. for one hour.

Next, a through hole is formed on a sheet material produced as in Example 1; furthermore 100 μm-thick sheet materials 810 and 812, which are filled with a conductive paste, are prepared; the core layer 805 and the multilayer ceramic substrate 809 are superimposed as shown in FIG. 8B; and then heating and pressing are carried out so as to form an integrated module. At this time, a copper foil 814 may be laminated on the lowest sheet material so as to form an integrated module, or as shown in FIG. 7A, a wiring pattern may be transferred by a release mold carrier on which a film-shaped component is formed. Moreover, a solder ball is mounted on the wiring pattern of the module produced by the above-mentioned method so as to make a connection terminal.

In order to evaluate the reliability of the component built-in module produced in this example, a hygroscopicity reflow test and a thermal shock test (a temperature cycle test) were conducted under the same conditions as in Example 1. At this time, no visible cracks were generated in the semiconductor built-in module, and abnormality was not recognized, even if a supersonic flaw detector was used. These tests show that the semiconductor and the module are adhered to each other strongly.

Furthermore, in order to evaluate the shock resistance of the module, the drop strength was evaluated by dropping the module from 1.8 m high. Specifically, the completed module was mounted onto the glass epoxy substrate by soldering and set into an aluminum container. When the container was dropped onto a concrete surface, the damage of the module was examined. In the case of the ceramic substrate produced as a comparative example, cracks were generated in about half of the ceramic substrates. On the other hand, no cracks were generated in the module of the Example 3. Thus, it is thought that the module in which the sheet material was used for adhesion works as a stress buffer layer that cannot be obtained by only the ceramic substrate, which is said to be a specific effect of the present invention.

Furthermore, a resistance value of the inner-via connection by the conductive paste was hardly changed from the initial performance.

As mentioned above, according to the component built-in module of the present invention, by using a sheet material of a mixture including a thermosetting resin and high concentrated inorganic filler, it is possible to bury active components and/or passive components inside the sheet, and the wiring pattern and the multilayer wiring of the electric insulating layer can be formed simultaneously on at least one surface the sheet material. Furthermore, by selecting an inorganic filler, it is possible to control the thermal conductivity, the coefficient of thermal expansion, and the dielectric constant. Thus, the coefficient of thermal expansion in the plane direction can be equalized to that of the semiconductor, so the substrate is effective to mount directly. Furthermore, by improving the thermal conductivity, it is effective as a substrate for mounting a semiconductor or the like, requiring the heat radiation. In addition, since it also is possible to lower the dielectric constant, it is effective to form the substrate with low loss as a substrate for high frequency circuit. In addition, by setting the modulus of elasticity and the glass transition temperature of the thermosetting resin at room temperature to fall into a certain range, it is possible to realize a component built-in module having a high reliability with respect to the thermal stress such as a thermal shock test.

Furthermore, the method for producing a component built-in module of the present invention includes: processing a mixture including an inorganic filler and an uncured state thermosetting resin into a sheet material; preparing a sheet material filled with a conductive resin; superimposing a release carrier onto one surface of which a wiring pattern is formed and active components and/or passive components are mounted onto the above-mentioned sheet material; furthermore superimposing the release carrier onto a release carrier that was prepared separately with the side of the wiring pattern surface of the release carrier faced inward; and burying the components in the sheet material by heating and pressing so as to be cured. Thus, the component built-in module of the present invention is obtained. Furthermore, it is possible to form a film-shaped component that leads out the wiring pattern formed on the release carrier as an electrode. Thus, it is possible to realize an extremely high-density module containing active components and/or passive components by a simple method. At the same time, since the wiring pattern can also be buried in the sheet material, a module having a smooth surface can be realized. Thus, since there is no level difference due to the wiring pattern on the surface of the module of the present invention, components can be mounted with higher density.

Furthermore, in the method for producing the multilayer structured component built-in module of the present invention, since not only an active component such as a semiconductor etc. and a passive component such as a chip resistor etc. can be contained, but also a multilayer ceramic substrate can be formed in an internal layer simultaneously, it is possible to realize an extremely high-density module. Furthermore, since a plurality of ceramic substrates having various performances can be laminated simultaneously, it is possible to realize an extremely high-performance module.

As mentioned above, according to the present invention, the active components or passive components can be contained into a module and wiring patterns can be connected by the inner via. Thus, it is possible to realize an extremely high-density module by a simple method.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A method for producing a component built-in module, comprising:

processing a mixture comprising at least an inorganic filler and an uncured state thermosetting resin into a sheet;

providing the sheet comprising an inorganic filler and an uncured state thermosetting resin with a through hole;

filling the through hole with a conductive resin;

mounting an active component and/or passive component on a copper foil;

superimposing the sheet in which the through hole is filled with a conductive resin onto the surface of the copper foil on which the components are mounted;

furthermore superimposing a copper foil;

burying the active and/or passive component in the sheet, followed by heating and pressing the sheet material, thereby curing the thermosetting resin and the conductive resin in the sheet;

then processing the copper foil on the outermost layer into a wiring pattern, thereby forming a core layer;

providing a through hole in a sheet comprising an inorganic filler and an uncured state thermosetting resin or an organic film having adhesive layers on both surfaces;

superimposing a copper foil, and the sheet or the organic film in which the through hole is filled with a conductive resin onto at least one surface of the core layer, followed by heating and pressing thereof so as to be integrated onto each other; and processing the copper foil into a wiring pattern.

2. The method for producing the component built-in module according to claim 1, wherein a film-shaped component is formed beforehand on the copper foil that is to be superimposed onto the core layer.

* * * * *